(12) United States Patent
Gribok (10) Patent No.: US 10,102,892 B1
(45) Date of Patent: Oct. 16, 2018

(54) RAM-BASED SHIFT REGISTER WITH EMBEDDED ADDRESSING

(71) Applicant: INTEL CORPORATION, Santa Clara, CA (US)

(72) Inventor: Sergey Gribok, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/611,070

(22) Filed: Jun. 1, 2017

(51) Int. Cl.
*G11C 8/10* (2006.01)
*G11C 8/04* (2006.01)
*G11C 8/18* (2006.01)
*G11C 7/10* (2006.01)

(52) U.S. Cl.
CPC .................. *G11C 8/04* (2013.01); *G11C 7/10* (2013.01); *G11C 8/18* (2013.01)

(58) Field of Classification Search
CPC ...................................... G11C 8/10; G11C 7/22
USPC ........................................ 365/189.12, 230.06
See application file for complete search history.

(56) References Cited

U.S. PATENT DOCUMENTS

| | | | |
|---|---|---|---|
| 3,824,562 A | 7/1974 | Leibowitz et al. | |
| 4,679,214 A | 7/1987 | Takemae | |
| 4,906,916 A | 3/1990 | Koslar | |
| 4,947,373 A * | 8/1990 | Yamaguchi | G11C 11/4096 365/189.04 |
| 4,959,811 A | 9/1990 | Szczepanek | |
| 5,150,201 A * | 9/1992 | Mehrgardt | H04N 9/64 348/537 |
| 5,153,846 A | 10/1992 | Rao | |
| 5,173,906 A * | 12/1992 | Dreibelbis | G06F 11/27 714/733 |
| 5,255,220 A * | 10/1993 | Filliman | G11C 8/16 365/189.04 |
| 5,619,622 A * | 4/1997 | Audi | B41J 2/04543 347/42 |
| 5,799,211 A | 8/1998 | Hakkarainen et al. | |
| 6,072,823 A * | 6/2000 | Takakusaki | H03K 3/84 327/164 |
| 6,901,072 B1 * | 5/2005 | Wong | H04L 12/4645 370/360 |
| 7,395,521 B1 * | 7/2008 | Ma | G06F 17/505 716/103 |
| 7,821,295 B1 | 10/2010 | Chiu | |
| 2002/0054045 A1 * | 5/2002 | Okumura | G11C 7/1018 345/573 |
| 2003/0135699 A1 * | 7/2003 | Matsuzaki | G06F 13/1605 711/149 |
| 2005/0281111 A1 * | 12/2005 | Urard | H03M 13/1137 365/221 |
| 2006/0236192 A1 * | 10/2006 | Friddell | H03M 13/2732 714/755 |

(Continued)

*Primary Examiner* — Michael Tran
(74) *Attorney, Agent, or Firm* — Compass IP Law PC (57) ABSTRACT

Unlike prior RAM-based shift register circuits, the presently-disclosed shift register circuit does not require control circuits to generate write and read address signals. Instead, the presently-disclosed shift register circuit utilizes a portion of RAM to store and provide the write and read address signals. The write and read addresses are output from the data output port of the RAM, and received by the write and read address ports of the RAM. Advantageously, the presently-disclosed shift register circuit requires less area to implement because the need for write and read control circuits is eliminated.

17 Claims, 5 Drawing Sheets

(56) References Cited

U.S. PATENT DOCUMENTS

| | | | |
|---|---|---|---|
| 2007/0050602 A1* | 3/2007 | Lien | G06F 9/3836 |
| | | | 712/217 |
| 2007/0156975 A1* | 7/2007 | Himpe | G06F 5/06 |
| | | | 711/154 |
| 2009/0021519 A1* | 1/2009 | Yusa | G09G 3/3688 |
| | | | 345/536 |
| 2009/0031089 A1* | 1/2009 | Tuominen | G06F 7/785 |
| | | | 711/149 |
| 2011/0310691 A1* | 12/2011 | Zhou | G11C 8/16 |
| | | | 365/230.03 |
| 2012/0057411 A1* | 3/2012 | Koeppe | G11C 19/28 |
| | | | 365/189.02 |
| 2014/0347518 A1* | 11/2014 | Tanaka | H04N 5/335 |
| | | | 348/231.99 |
| 2016/0087649 A1* | 3/2016 | Limberg | H04N 21/2383 |
| | | | 714/776 |

\* cited by examiner

RAM-BASED SHIFT REGISTER WITH EMBEDDED ADDRESSING

BACKGROUND

Technical Field

The present invention relates generally to electronic circuits.

Description of the Background Art

A shift register is a digital electronic circuit that delays an input signal by a number of clock cycles. Shift registers are highly useful circuits. For example, multiple shift registers are used in pipelined digital circuits.

DETAILED DESCRIPTION

The present disclosure provides a new and advantageous circuit design for a shift register. Previous RAM-based shift registers have reduced area and power consumption compared with a straightforward implementation using a series of flip-flop circuits. However, the presently-disclosed shift register circuit design may be used advantageously, in at least some instances, to further reduce the area needed to implement the shift register. The area is reduced because the need for write and read control circuits is eliminated.

Figure 1:
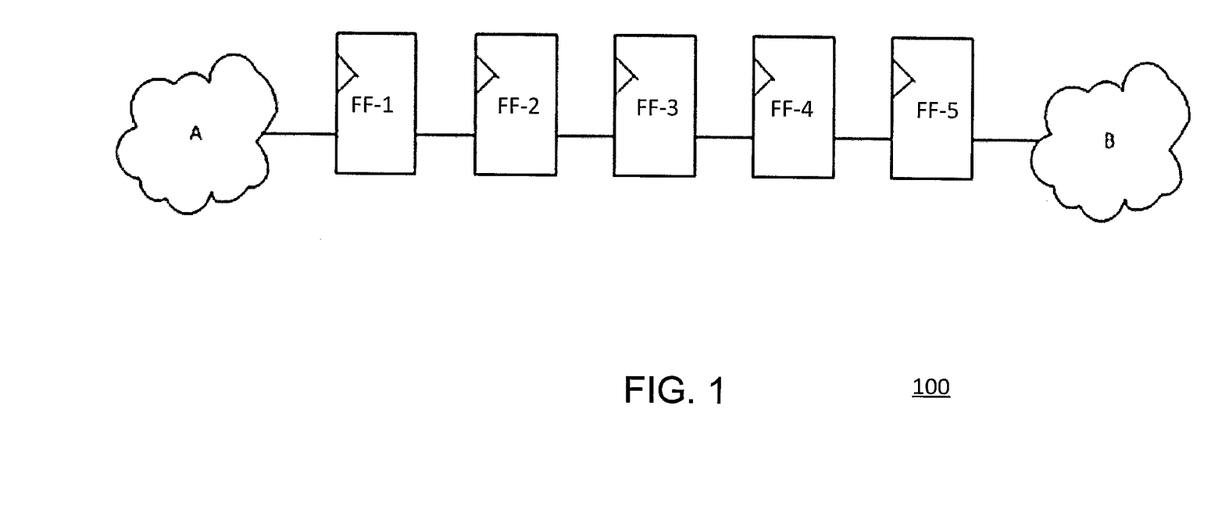
FIG. 1 is a circuit diagram showing a straightforward implementation of a shift register.

FIG. 1 is a circuit diagram showing a straightforward implementation of a shift register 100 using 5 sequentially connected flip-flop circuits FF-1, FF-2, FF-3, FF-4 and FF-5. Each flip-flop circuit includes a clock input, a data input and a data output. Each flip-flop circuit may hold N data bits such that the data input and output are both N-bits wide. The clock input to each flip-flop circuit may be the same clock signal.

During each clock cycle, an N-bit data signal Dn may be shifted from one flip-flop circuit to the next in the series. During the clock cycle 0, D0 may be input from circuit A to FF-1. During the clock cycle 1, D1 may be shifted from circuit A to FF-1, and D0 may be input from FF1 to FF2. During the clock cycle 2, D2 may be shifted from circuit A to FF1, D1 may be shifted from FF-1 to FF-2, and D0 may be input from FF-2 to FF-3. During the clock cycle 3, D3 may be input from circuit A to FF1, D2 may be shifted from FF-1 to FF-2, D1 may be shifted from FF-2 to FF-3, and D0 may be shifted from FF-3 to FF-4. During the clock cycle 4, D4 may be input from circuit A to FF1, D3 may be shifted from FF-1 to FF-2, D2 may be shifted from FF-2 to FF-3, D1 may be shifted from FF-3 to FF-4, and D0 may be shifted from FF-4 to FF-5. During the clock cycle 5, D5 may be input from circuit A to FF1, D4 may be shifted from FF-1 to FF-2, D3 may be shifted from FF-2 to FF-3, D2 may be shifted from FF-3 to FF-4, D1 may be shifted from FF-4 to FF-5, and D0 may be output from FF-5 to circuit B. And so on. Thus, the shift register 100 provides a 5-cycle delay for the data signal Dn.

Figure 2:
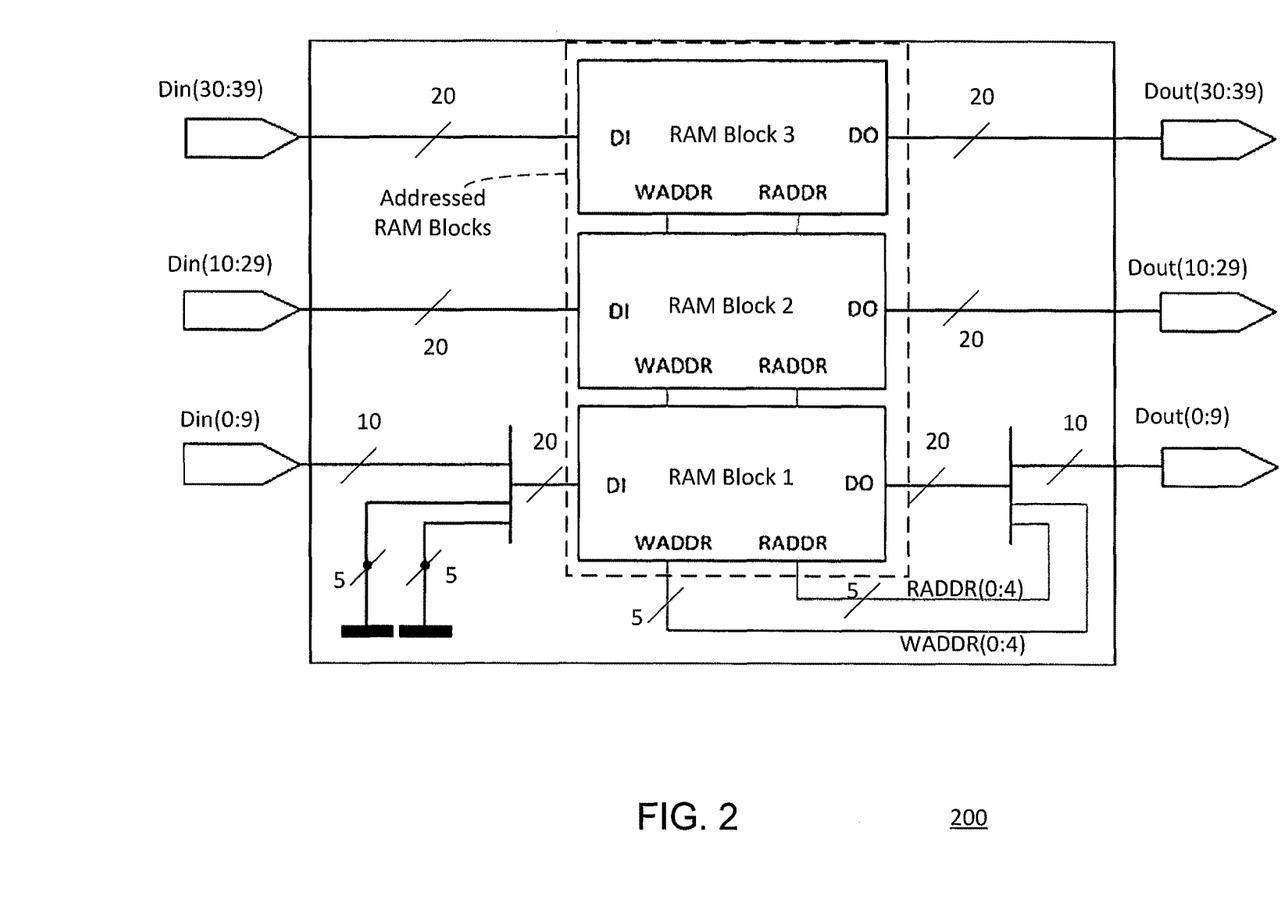
FIG. 2 is a diagram of an exemplary implementation of a shift register circuit using random access memory (RAM) with embedded addressing in accordance with an embodiment of the invention.

FIG. 2 is a diagram of an exemplary implementation of a shift register circuit 200 using RAM with embedded addressing in accordance with an embodiment of the invention. The shift register circuit 200 may be configured to include one or more addressed RAM blocks. In the exemplary implementation shown, there are three addressed RAM blocks (RAM Block 1, RAM Block 2, and RAM Block 3). More generally, the number of addressed RAM blocks depends on the desired data width of the shift register.

Each RAM block includes a data input (DI) port, a data output (DO) port, a write address (WADDR) port, and a read address (RADDR) port. In the exemplary implementation shown, each RAM block stores 32 words, each word being 20 bits wide. Because each stored word is 20 bits wide, the DI and DO ports are each 20 bits wide. Because 32 words are stored in a RAM Block, the WADDR and RADDR signals are 5 bits wide.

Unlike prior RAM-based shift register circuits, the presently-disclosed shift register circuit 200 requires neither a write control circuit to generate the write address (WADDR) signal, nor a read control circuit to generate the read address (RADDR) signal. Instead, the presently-disclosed shift register circuit 200 utilizes a portion of an addressed RAM block to store and provide both WADDR and RADDR signals. The array of read addresses for the RADDR signal and the array of write addresses for the WADDR signal may be stored in the RAM block during configuration of a programmable logic device, such as a field programmable gate array, for example.

During operation of the shift register, the address at the RADDR port indicates the content to be output at a cycle, and that content includes not only the delayed data word, but also the WADDR and RADDR signals for the next cycle. This advantageously avoids the need for write and read control circuits.

In the exemplary implementation shown in FIG. 2, instead of storing 20 bits of data per location, RAM Block 1 stores 10 bits of data plus 5 bits of a next write address and 5 bits of a next read address at each location. In other words, for each 20-bit word in RAM Block 1, 5 bits are used to provide the WADDR(0:4) signal, and 5 bits are used to provide the RADDR(0:4) signal. The remaining 10 bits of each word in RAM Block 1 are used to store (and delay) up to the first 10 bits of the data signal. Meanwhile, RAM Blocks 2 and 3 may each still store (and delay) a full 20 bits of the data signal.

In this exemplary implementation, if the width of the data signal is 10 bits or less, than further RAM blocks beyond RAM Block 1 are not needed. If the width of the data signal is in the range of 11 bits to 30 bits, then RAM Block 2 is used to store and delay up to the next 20 bits of the data signal, receiving Din(10:29) and outputting Dout(10:29). If the width of the data signal is in the range of 31 bits to 50 bits, then RAM Block 3 is used to store and delay up to the next 20 bits of the data signal, receiving Din(30:49) and outputting Dout(30:49). If the width of the data signal is in the range of 51 bits to 70 bits, then yet another RAM block (i.e. RAM Block 4) is also needed. And so on.

Consider an example of a 32×10 shift register, where the shift register delays the input data signal by 32 clock cycles, and the data width is 10 bits. Such a 32×10 shift register may be implemented using a single 32×20 RAM block. Hence, in FIG. 2, only RAM Block 1 would be needed (RAM Blocks 2 and higher are not needed). In this case, RAM Block 1 may have the following initial contents for the 32 words held therein.

TABLE 1

Initial contents of RAM Block 1 for 32 × 10 shift register (32-cycle delay).

| | Read-write | Read-only | |
|---|---|---|---|
| | Data | R | W |
| 31 | 0000000000 | 00000 | 11111; |
| 30 | 0000000000 | 11111 | 11110; |
| 29 | 0000000000 | 11110 | 11101; |
| 28 | 0000000000 | 11101 | 11100; |
| 27 | 0000000000 | 11100 | 11011; |
| 26 | 0000000000 | 11011 | 11010; |
| 25 | 0000000000 | 11010 | 11001; |
| 24 | 0000000000 | 11001 | 11000; |
| 23 | 0000000000 | 11000 | 10111; |
| 22 | 0000000000 | 10111 | 10110; |
| 21 | 0000000000 | 10110 | 10101; |
| 20 | 0000000000 | 10101 | 10100; |
| 19 | 0000000000 | 10100 | 10011; |
| 18 | 0000000000 | 10011 | 10010; |
| 17 | 0000000000 | 10010 | 10001; |
| 16 | 0000000000 | 10001 | 10000; |
| 15 | 0000000000 | 10000 | 01111; |
| 14 | 0000000000 | 01111 | 01110; |
| 13 | 0000000000 | 01110 | 01101; |
| 12 | 0000000000 | 01101 | 01100; |
| 11 | 0000000000 | 01100 | 01011; |
| 10 | 0000000000 | 01011 | 01010; |
| 9 | 0000000000 | 01010 | 01001; |
| 8 | 0000000000 | 01001 | 01000; |
| 7 | 0000000000 | 01000 | 00111; |
| 6 | 0000000000 | 00111 | 00110; |
| 5 | 0000000000 | 00110 | 00101; |
| 4 | 0000000000 | 00101 | 00100; |
| 3 | 0000000000 | 00100 | 00011; |
| 2 | 0000000000 | 00011 | 00010; |
| 1 | 0000000000 | 00010 | 00001; |
| 0 | 0000000000 | 00001 | 00000. |

As indicated in the above Table 1, the lowest-order 5 bits of each of the 32 words are write addresses, and the next-lowest-order 5 bits of each of the 32 words are read addresses. These lowest-order 10 bits are configured as read-only bits since these addresses do not change during operation of the shift register. The higher-order 10 bits of each of the 32 words are configured as read-write bits since they are to hold the data that is traversing through, and being delayed by, the shift register. (Note that, if the width of the data word was greater than 10 bits, then RAM Block 2 would be utilized to hold the additional data width above the 10-bit width stored in RAM Block 1. Furthermore, if the width of the data word was greater than 30 bits, then RAM Block 3 would be utilized to hold the additional data width above the 30-bit data width stored in RAM Blocks 1 and 2. And so on.)

Initially, during clock cycle 0, data word D0 may be received via the DI port. In addition, the read address of 00001 (1 in decimal) stored at address 0 may be received at the RADDR port, and the write address of 00000 (0 in decimal) stored at address 0 may be received at the WADDR port.

At clock cycle 1, because the WADDR port has the write address 00000, the data word D0 is written over previous data stored at address 0. Because the RADDR port has the read address 00001, the data word stored at address 1 is output via the DO port. [Note that the initial data values output from the shift register do not have meaning until the first data word from the input (i.e. D0) is output. This occurs at clock cycle 32.] In addition, the read address of 00010 (2 in decimal) stored at address 1 is output from the DO port (and received by the RADDR port), and the write address of 00001 (1 in decimal) stored at address 1 is output from the DO port (and received by the WADDR port). Furthermore, data word D1 is received by the DI port.

At clock cycle 2, because the WADDR port has the write address 00001, the data word D1 is written over previous data stored at address 1. Because the RADDR port receives the read address 00010, the data word stored at address 2 is output via the DO port. In addition, the read address of 00011 (3 in decimal) stored at address 2 is output from the DO port (and received by the RADDR port), and the write address of 00010 (2 in decimal) stored at address 2 is output from the DO port (and received by the WADDR port). Furthermore, data word D2 is received by the DI port.

At clock cycle 3, because the WADDR port has the write address 00010, the data word D2 is written over previous data stored at address 2. Because the RADDR port has the read address 00011, the data word stored at address 3 is output via the DO port. In addition, the read address of 00100 (4 in decimal) stored at address 3 is output from the DO port (and received by the RADDR port), the write address of 00011 (3 in decimal) stored at address 3 is output from the DO port (and received by the WADDR port). Furthermore, data word D3 is received by the DI port.

And so on for clock cycles 4 to 30.

At clock cycle 31, because the WADDR port has the write address 11110, the data word D30 is written over previous data stored at address 30. Because the RADDR port has the read address 11111, the data word stored at address 31 is output via the DO port. In addition, the read address of 00000 (0 in decimal) stored at address 31 is output from the DO port (and received by the RADDR port), and the write address of 11111 (31 in decimal) stored at address 31 is output from the DO port (and received by the WADDR port). Furthermore, data word D31 is received by the DI port.

At clock cycle 32, because the WADDR port has the write address 11111, the data word D31 is written over previous data stored at address 31. Because the RADDR port has the read address 00000, the data word stored at address 0 (i.e. D0) is output via the DO port. In addition, the read address of 00001 (1 in decimal) stored at address 0 is output from the DO port (and received by the RADDR port), and the write address of 00000 (0 in decimal) stored at address 0 is output from the DO port (and received by the WADDR port). Furthermore, data word D32 is received by the DI port.

At clock cycle 33, because the WADDR port has the write address 00000, the data word D32 is written over previous data (i.e. D0) stored at address 0. Because the RADDR port has the read address 00001, the data word stored at address 1 (i.e. D1) is output via the DO port. In addition, the read address of 00010 (2 in decimal) stored at address 1 is output from the DO port (and received by the RADDR port), and the write address of 00001 (1 in decimal) stored at address 1 is output from the DO port (and received by the WADDR port). Furthermore, data word D33 is received by the DI port.

At clock cycle 34, because the WADDR port has the write address 00001, the data word D33 is written over previous data (i.e. D1) stored at address 1. Because the RADDR port has the read address 00010, the data word stored at address 2 (i.e. D2) is output via the DO port. In addition, the read address of 00011 (3 in decimal) stored at address 2 is output from the DO port (and received by the RADDR port), and the write address of 00010 (2 in decimal) stored at address 2 is output from the DO port (and received by the WADDR port). Furthermore, data word D34 is received by the DI port.

And so on for clock cycles 35 onwards.

For purposes of illustration, the contents of RAM Block 1 at the end of clock cycle 34 is shown below in TABLE 2.

TABLE 2

Contents of RAM Block 1 at end of clock cycle 34.

| | Read-write | Read-only | |
|---|---|---|---|
| | Data | R | W |
| 31 | [D31] | 00000 | 11111; |
| 30 | [D30] | 11111 | 11110; |
| 29 | [D29] | 11110 | 11101; |
| 28 | [D28] | 11101 | 11100; |
| 27 | [D27] | 11100 | 11011; |
| 26 | [D26] | 11011 | 11010; |
| 25 | [D25] | 11010 | 11001; |
| 24 | [D24] | 11001 | 11000; |
| 23 | [D23] | 11000 | 10111; |
| 22 | [D22] | 10111 | 10110; |
| 21 | [D21] | 10110 | 10101; |
| 20 | [D20] | 10101 | 10100; |
| 19 | [D19] | 10100 | 10011; |
| 18 | [D18] | 10011 | 10010; |
| 17 | [D17] | 10010 | 10001; |
| 16 | [D16] | 10001 | 10000; |
| 15 | [D15] | 10000 | 01111; |
| 14 | [D14] | 01111 | 01110; |
| 13 | [D13] | 01110 | 01101; |
| 12 | [D12] | 01101 | 01100; |
| 11 | [D11] | 01100 | 01011; |
| 10 | [D10] | 01011 | 01010; |
| 9 | [D9] | 01010 | 01001; |
| 8 | [D8] | 01001 | 01000; |
| 7 | [D7] | 01000 | 00111; |
| 6 | [D6] | 00111 | 00110; |
| 5 | [D5] | 00110 | 00101; |
| 4 | [D4] | 00101 | 00100; |
| 3 | [D3] | 00100 | 00011; |
| 2 | [D2] | 00011 | 00010; |
| 1 | [D33] | 00010 | 00001; |
| 0 | [D32] | 00001 | 00000. |

In accordance with an embodiment of the invention, there is a difference between the write and read addresses stored at the same RAM address in the array stored in RAM Block 1. The difference d may be defined to be the read address minus the write address at the same RAM address (i.e. at the same row in the above tables).

In the exemplary implementation described above in relation to Tables 1 and 2, the difference d is such that d mod 32=1, which results in a delay of 32−d mod 32+1=32−1+1=32 cycles. Thus, the delay in cycles varies depending on the difference d.

For example, Table 3 below shows the write and read addresses that may be configured in the array to provide a delay of 30 cycles. In Table 3, the difference d is such that d mod 32=3, which results in a delay of 32−d mod 32+1=32−3+1=30 cycles.

Generalizing the above, if the depth of the RAM Block is N, then the delay in cycles is N−d mod N+1. For a dual-port RAM that uses the same clock for reading and writing, the difference d mod N should be greater than zero to avoid the output reading the newly written value to the same address.

More generally, the array may store a pre-calculated sequence of read addresses and a pre-calculated sequence of write addresses, and the sequence of write addresses may be a circular shift of the sequence of read addresses. Different techniques may be possible to use to generate the sequences. For example, a gray-coding technique may be used, or a technique that uses a linear feedback shift register (LFSR).

TABLE 3

Example contents of RAM Block 1 for 32 × 10 shift register (30-cycle delay).

| | Read-write | Read-only | |
|---|---|---|---|
| | Data | R | W |
| 31 | 0000000000 | 00000 | 11101; |
| 30 | 0000000000 | 11111 | 11100; |
| 29 | 0000000000 | 11110 | 11011; |
| 28 | 0000000000 | 11101 | 11010; |
| 27 | 0000000000 | 11100 | 11001; |
| 26 | 0000000000 | 11011 | 11000; |
| 25 | 0000000000 | 11010 | 10111; |
| 24 | 0000000000 | 11001 | 10110; |
| 23 | 0000000000 | 11000 | 10101; |
| 22 | 0000000000 | 10111 | 10100; |
| 21 | 0000000000 | 10110 | 10011; |
| 20 | 0000000000 | 10101 | 10010; |
| 19 | 0000000000 | 10100 | 10001; |
| 18 | 0000000000 | 10011 | 10000; |
| 17 | 0000000000 | 10010 | 01111; |
| 16 | 0000000000 | 10001 | 01110; |
| 15 | 0000000000 | 10000 | 01101; |
| 14 | 0000000000 | 01111 | 01100; |
| 13 | 0000000000 | 01110 | 01011; |
| 12 | 0000000000 | 01101 | 01010; |
| 11 | 0000000000 | 01100 | 01001; |
| 10 | 0000000000 | 01011 | 01000; |
| 9 | 0000000000 | 01010 | 00111; |
| 8 | 0000000000 | 01001 | 00110; |
| 7 | 0000000000 | 01000 | 00101; |
| 6 | 0000000000 | 00111 | 00100; |
| 5 | 0000000000 | 00110 | 00011; |
| 4 | 0000000000 | 00101 | 00010; |
| 3 | 0000000000 | 00100 | 00001; |
| 2 | 0000000000 | 00011 | 00000; |
| 1 | 0000000000 | 00010 | 11111; |
| 0 | 0000000000 | 00001 | 11110. |

Figure 3:
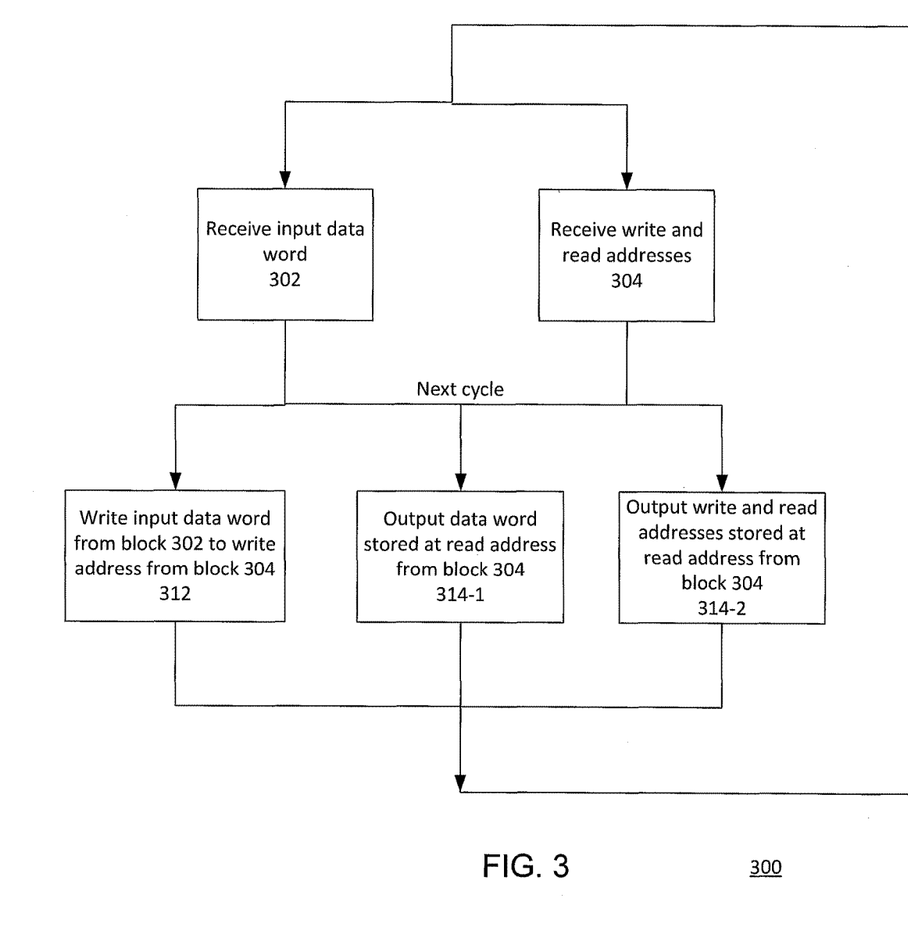
FIG. 3 is a flow chart of a method of delaying a data input signal using a shift register implemented using RAM with embedded addressing in accordance with an embodiment of the invention.

FIG. 3 is a flow chart of a method 300 of delaying a data input signal using a shift register implemented using RAM with embedded write and read addressing accordance with an embodiment of the invention. The method 300 may be performed using the exemplary structure for a shift register circuit 200 described above in relation to FIG. 2. The description below refers to a RAM circuit. As depicted in FIG. 2, the RAM circuit may include one or more RAM blocks, depending on the width of the data word, the depth of the shift register, and the width and depth of each RAM block.

Per block 302, the RAM circuit receives an input data word. In addition, per block 304, the RAM circuit receives read and write addresses that are output from the RAM circuit itself. As described above in relation to FIG. 2, the read and write addresses are stored in an array within the RAM circuit such that a portion of the data output from the RAM circuit during a cycle comprises the read and write addresses for the next cycle.

After blocks 302 and 304, a next cycle starts. Per block 312, the RAM circuit stores the input data word received in block 302 at the storage location indicated by the write address received in block 304. In addition, per block 314-1, the RAM circuit outputs the data word from the storage location indicated by the read address received in block 304. At the same time, per block 314-2, the RAM circuit outputs the read and write addresses from the storage location indicated by the read address received in block 304. The method 300 then loops back to blocks 302 and 304 and continues.

Unlike prior RAM-based shift register circuits, the presently-disclosed shift register circuit does not require write and read control circuits to generate the write and read address signals. Instead, the presently-disclosed shift register circuit utilizes a portion of the RAM to store and provide the write and read address signals. The write and read addresses are output from the data output port of the RAM, and received by the write and read address ports of the RAM.

Advantageously, implement the presently-disclosed shift register circuit requires less area to implement because the write and read control circuits are eliminated.

Exemplary Field Programmable Gate Array and Electronic System

Figure 4:
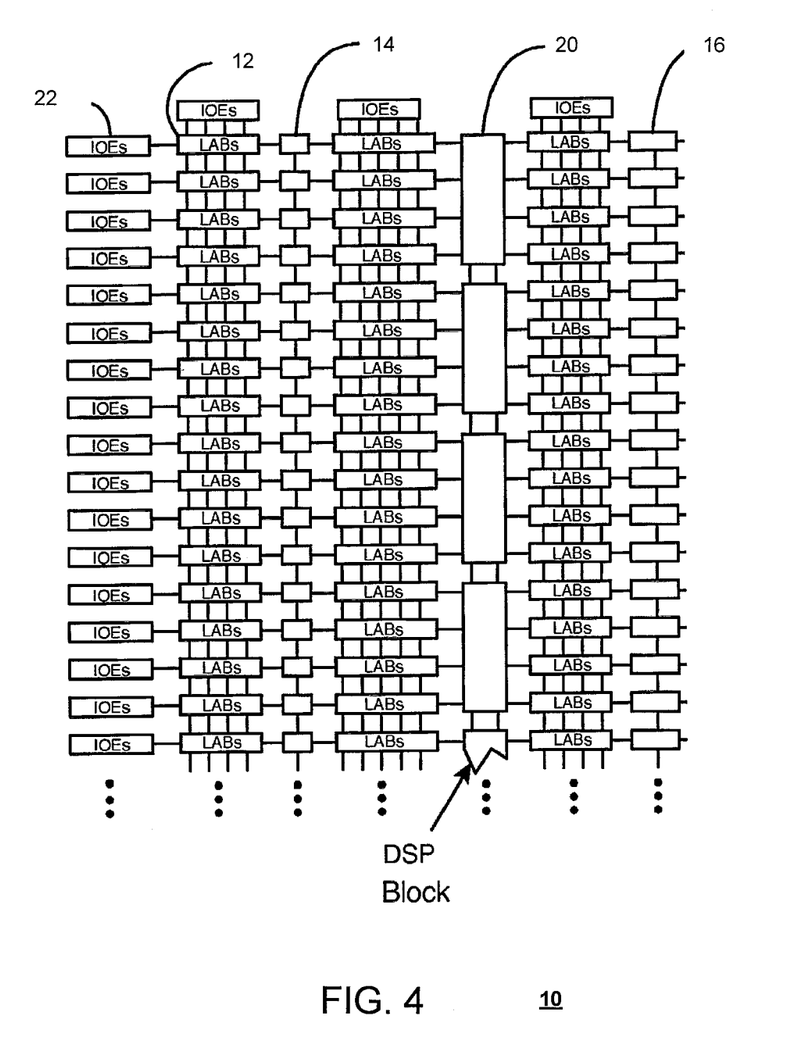
FIG. 4 is an exemplary simplified partial block diagram of a field programmable gate array (FPGA) that may be configured to implement an embodiment of the present invention.

FIG. 4 is a simplified partial block diagram of a field programmable gate array (FPGA) 10 that may be arranged to include aspects of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14 and blocks 16. These memory blocks can also include shift registers and FIFO buffers. Furthermore, in an exemplary implementation, the LABs 12 may be configured as memory blocks (referred to as MLABs). The presently-disclosed invention may be implemented so as to advantageously utilize MLABs to form the RAM Blocks shown in FIG. 2.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each IOE 22 is coupled to an external terminal (i.e., a pin) of FPGA 10.

It is to be understood that FPGA 10 is described herein for illustrative purposes only and that the present invention can be implemented in many different types of PLDs, FPGAs, and ASICs.

Figure 5:
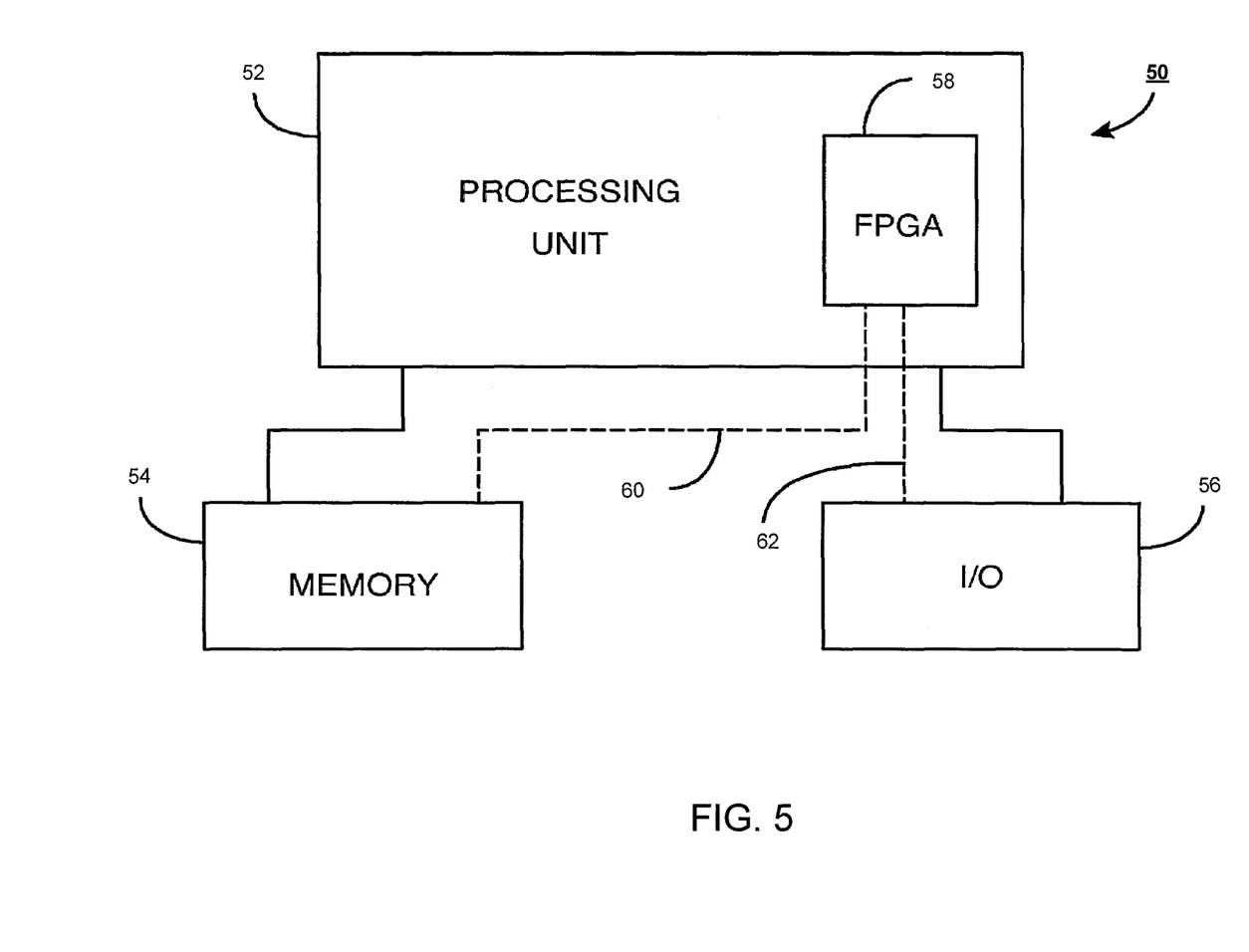
FIG. 5 shows a block diagram of an exemplary digital system that may be configured to utilize an embodiment of the present invention.

FIG. 5 shows a block diagram of an exemplary digital system 50 that can embody techniques of the present invention. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

Exemplary Embodiments

Exemplary embodiments of the presently disclosed invention include the following.

One embodiment relates to a shift register circuit to delay a data signal. The shift register circuit including: a random access memory circuit having a data input port, a data output port, a clock port, a write address port, and a read address port, wherein the random access memory circuit stores an array of write addresses and read addresses; connections to the data input port to receive an input data word; connections from the data output port to the write address port to provide a write address from the array to the write address port; connections from the data output port to the read address port to provide a read address from the array to the read address port; and connections from the data output port to provide a delayed data word.

The random access memory circuit may include a plurality of random access memory blocks. One of the random access memory blocks may store the array of write addresses and read addresses. The array may store a sequence of read addresses and a sequence of write addresses. The sequence of write addresses may be a circular shift of the sequence of read addresses. The array of write addresses and read addresses may be stored in read-only memory, while data words of the data signal may be stored in read-write memory. The array of write addresses and read addresses may be stored during electronic configuration of an integrated circuit.

Another embodiment relates to a method of operating a shift register circuit to delay a data signal. An input data word is written to a write address of a random access memory, where the input data word was received at a data input port of the random access memory, and the write address was received at a write address port of the random access memory. A data word stored at a read address of the random access memory is output, where the read address was received at a write address port of the random access memory. Next write and read addresses stored at the read address of the random access memory are output.

The random access memory may include a plurality of random access memory blocks. One of the random access memory blocks may store the next write and read addresses in an array. The array of next write and read addresses may be stored in read-only memory, while data words of the data signal are stored in read-write memory. The array of next write and read addresses may be stored during electronic configuration of an integrated circuit. The array may store a sequence of read addresses and a sequence of write addresses. The sequence of write addresses may be a circular shift of the sequence of read addresses.

Another embodiment relates to an integrated circuit. The integrated circuit includes a plurality of random access memory blocks and a shift register circuit. The shift register is formed using a random access memory circuit that comprises at least one of the random access memory blocks. The random access memory circuit stores an array of write addresses and read addresses that are provided, respectively, to a write address port and a read address port of the random access memory circuit.

The random access memory circuit may include a data output port. The shift register circuit may include connections from the data output port to the write address port to provide a next write address from the array and connections from the data output port to the read address port to provide a next read address from the array. The random access memory circuit may further include a data input port, and the shift register circuit may further include connections to the data input port to receive an input data word and connections from the data output port to provide a delayed data word. The array may store a sequence of read addresses and a sequence of write addresses. The sequence of write addresses may be a circular shift of the sequence of read addresses. The array of write addresses and read addresses may be stored in read-only memory, while data words of the data signal may be stored in read-write memory. The integrated circuit may be a programmable logic device, and the array of write and read addresses may be stored during electronic configuration of the programmable logic device.

Another embodiment relates to a system of electronics. The system includes a processing unit and a programmable logic in the processing unit. The programmable logic is configured to implement a shift register circuit. The shift register circuit includes a random access memory circuit having a data input port, a data output port, a clock port, a write address port, and a read address port. The random access memory circuit stores an array of write addresses and read addresses. The shift register further includes: connections to the data input port to receive an input data word; connections from the data output port to the write address port to provide a write address from the array to the write address port; connections from the data output port to the read address port to provide a read address from the array to the read address port; and connections from the data output port to provide a delayed data word.

The random access memory circuit may include a plurality of random access memory blocks. One of the random access memory blocks stores the array of write addresses and read addresses. The array may store a sequence of read addresses and a sequence of write addresses. The sequence of write addresses may be a circular shift of the sequence of read addresses. The array of write addresses and read addresses may be stored in read-only memory, while data words of the data signal may be stored in read-write memory. The array of write addresses and read addresses is stored during electronic configuration of programmable logic.

Another embodiment relates to an apparatus that delays a data signal. The apparatus includes memory means for storing an array of write addresses and read addresses, the memory means having a data input port, a data output port, a clock port, a write address port, and a read address port. The apparatus further includes: connections to the data input port to receive an input data word; connections from the data output port to the write address port to provide a write address from the array to the write address port; connections from the data output port to the read address port to provide a read address from the array to the read address port; and connections from the data output port to provide a delayed data word.

The memory means may include a plurality of random access memory blocks. One of the random access memory blocks may store the array of write addresses and read addresses. The array may store a sequence of read addresses and a sequence of write addresses. The sequence of write addresses may be a circular shift of the sequence of read addresses. The array of write addresses and read addresses may be stored in read-only memory, while data words of the data signal may be stored in read-write memory. The array of write addresses and read addresses may be stored during electronic configuration of an integrated circuit.

CONCLUSION

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A shift register circuit to delay a data signal, the shift register comprising:
 a random access memory circuit having a data input port, a data output port, a clock port, a write address port, and a read address port, wherein the random access memory circuit stores an array of write addresses and read addresses within the random access memory circuit;

connections to the data input port to receive an input data word;

connections from the data output port to the write address port to provide a write address from the array within the random access memory circuit to the write address port;

connections from the data output port to the read address port to provide a read address from the array within the random access memory circuit to the read address port; and connections from the data output port to provide a delayed data word, wherein the array of write addresses and read addresses are stored in read-only memory, while data words of the data signal are stored in read-write memory.

2. The shift register circuit of claim 1, wherein the random access memory circuit comprises a plurality of random access memory blocks.

3. The shift register circuit of claim 2, wherein one of the random access memory blocks stores the array of write addresses and read addresses.

4. The shift register circuit of claim 1, wherein the array stores a sequence of read addresses and a sequence of write addresses.

5. The shift register circuit of claim 4, wherein the sequence of write addresses is a circular shift of the sequence of read addresses.

6. The shift register circuit of claim 1, wherein the array of write addresses and read addresses is stored during electronic configuration of an integrated circuit.

7. A method of operating a shift register circuit to delay a data signal, the method comprising:

writing an input data word to a write address of a random access memory, wherein the input data word was received at a data input port of the random access memory, and the write address was received at a write address port of the random access memory;

outputting a data word stored at a read address of the random access memory, wherein the read address was received at a write address port of the random access memory; and outputting next write and read addresses stored at the read address of the random access memory.

8. The method of claim 7, wherein the random access memory comprises a plurality of random access memory blocks, and wherein one of the random access memory blocks stores the next write and read addresses in an array within the random access memory.

9. The method of claim 8, wherein the array of next write and read addresses is stored in read-only memory, while data words of the data signal are stored in read-write memory.

10. The method of claim 7, wherein the array of next write and read addresses is stored during electronic configuration of an integrated circuit.

11. The method of claim 7, wherein the array stores a sequence of read addresses and a sequence of write addresses.

12. The method of claim 11, wherein the sequence of write addresses is a circular shift of the sequence of read addresses.

13. An integrated circuit comprising:

a plurality of random access memory blocks; and a shift register circuit formed using a random access memory circuit that comprises at least one of the random access memory blocks, wherein the random access memory circuit stores an array of write addresses and read addresses that are provided within the random access memory circuit, respectively, to a write address port and a read address port of the random access memory circuit, wherein the random access memory circuit further comprises a data output port, and wherein the shift register circuit comprises connections from the data output port to the write address port to provide a next write address from the array and connections from the data output port to the read address port to provide a next read address from the array, wherein the integrated circuit comprises a programmable logic device.

14. The integrated circuit of claim 13, wherein the random access memory circuit further comprises a data input port, and wherein the shift register circuit further comprises connections to the data input port to receive an input data word and connections from the data output port to provide a delayed data word.

15. The integrated circuit of claim 13, wherein the array stores a sequence of read addresses and a sequence of write addresses.

16. The integrated circuit of claim 15, wherein the sequence of write addresses is a circular shift of the sequence of read addresses.

17. The integrated circuit of claim 13, wherein the array of write addresses and read addresses is stored in read-only memory, while data words of the data signal are stored in read-write memory.

* * * * *